United States Patent [19]

Muller et al.

[11] Patent Number: 5,665,622
[45] Date of Patent: Sep. 9, 1997

[54] FOLDED TRENCH AND RIE/DEPOSITION PROCESS FOR HIGH-VALUE CAPACITORS

[75] Inventors: Karl Paul Ludwig Muller, Wappingers Falls; Wesley C. Natzle, New Paltz, both of N.Y.

[73] Assignee: International Business Machines Corporation, Armonk, N.Y.

[21] Appl. No.: 404,780

[22] Filed: Mar. 15, 1995

[51] Int. Cl.$^6$ .................... H01L 21/8242; H01L 21/3065
[52] U.S. Cl. .................. 438/243; 438/386; 438/699; 438/700; 438/702
[58] Field of Search ................. 437/47, 52, 60, 437/203, 228 MEM, 228 TR, 919; 148/DIG. 14, DIG. 111; 156/657.1

[56] References Cited

U.S. PATENT DOCUMENTS

| | | | |
|---|---|---|---|
| 4,650,544 | 3/1987 | Erb et al. | 437/228 TR |
| 4,849,854 | 7/1989 | Eguchi | 437/60 |
| 4,866,494 | 9/1989 | Kurosawa | |
| 4,987,470 | 1/1991 | Suzuki et al. | |
| 5,013,680 | 5/1991 | Lowrey et al. | 437/47 |
| 5,061,650 | 10/1991 | Dennison et al. | 437/47 |
| 5,097,381 | 3/1992 | Vo | 437/52 |
| 5,126,280 | 6/1992 | Chan et al. | 437/52 |
| 5,150,276 | 9/1992 | Gonzalez et al. | 437/52 |
| 5,168,073 | 12/1992 | Gonzalez et al. | 437/52 |
| 5,204,280 | 4/1993 | Dhong et al. | 437/52 |
| 5,231,044 | 7/1993 | Jun | 437/52 |
| 5,244,824 | 9/1993 | Sivan | 437/52 |
| 5,256,588 | 10/1993 | Witek et al. | 437/52 |
| 5,266,514 | 11/1993 | Tuan et al. | 437/52 |
| 5,292,689 | 3/1994 | Cronin et al. | 437/228 |
| 5,328,554 | 7/1994 | Ingram | 437/245 |
| 5,482,885 | 1/1996 | Lur et al. | 437/60 |
| 5,538,592 | 7/1996 | Chen et al. | 437/919 |
| 5,545,582 | 8/1996 | Roh | 437/60 |

OTHER PUBLICATIONS

H. Watanabe et al., J. Appl. Phys., 71(7) (1992) 3538, "Device application . . . for HSG Si" Apr. 1992.
S. Wolf, "Silicon Processing for the VLSI Era" vol. II, pp. 42–44, 200–205, 238–240 Jun. 1990.
"Pillar Dram Cell With Dual Channels and an Underneath Trench-in-Trench Capacitor Built on Soi Structure"; IBM Technical Disclosure Bulletin; B. Wu; vol. 36, No. 11, Nov. 1993, pp. 141–143.
"Folded Trench Capacitor CMOS Cell"; IBM Technical Disclosure Bulletin, M. Arienzo, vol. 32, No. 4A, Sep. 19, pp. 287–289.
"A Novel Trench Capacitor Structure for ULSI DRAMs"; T.V. Rajeevakumar et al; 1991 Symposium On VLSI Technology; May 1991; pp. 7 and 8.

Primary Examiner—Charles L. Bowers, Jr.
Assistant Examiner—Leon Radomsky
Attorney, Agent, or Firm—Whitham, Curtis, Whitham & McGinn; Eric W. Petraske

[57] ABSTRACT

Isotropic deposition of a selectively etchable material in an opening in a body of material followed by isotropic deposition of an etch resistant material forms a mask for anisotropic etching of the selectively etchable material at potentially sub-lithographic dimensions to form potentially sub-lithographic features within a trench. This process can be exploited to form a folded trench capacitor in which a trench is formed with one or more upstanding and possibly hollow features therein; effectively multiplying the surface area and or allowing reduced trench depth for a given charge storage capacity or a combination thereof. Further surface treatments such as deposition of hemispherical grain silicon can be used to further enhance the effective area of the trench. Isolation structures of sub-lithographic dimensions can also be formed by depositing appropriate materials within the trenches formed in accordance with the mask.

25 Claims, 4 Drawing Sheets

FOLDED TRENCH AND RIE/DEPOSITION PROCESS FOR HIGH-VALUE CAPACITORS

BACKGROUND OF THE INVENTION

1. Field of the Invention

The present invention generally relates to integrated circuit structures and methods of fabrication thereof and, more particularly, to the formation of high-value capacitors within small areas of an integrated circuit device or wafer and isolation structures of reduced size.

2. Description of the Prior Art

The increases in integration density achieved in integrated circuits in recent years have generally been accompanied by improvements in performance of the electronic devices formed therein and the integrated circuit devices, themselves, resulting from the reduced propagation times of signals over the distances between more closely packed devices. Substantial reductions in the cost of each electronic device therein has also been achieved since many more devices can be simultaneously formed than in the past even though newly developed and highly sophisticated techniques are often required for device fabrication.

However, the physical laws which govern the electrical properties of electronic devices limit the sizes to which some types of electronic devices can be scaled. Specifically, the capacitance of a charge storage structure is a well-known function of the area of spaced conductors, the spacing between the spaced conductors and the dielectric constant of material interposed between the spaced conductors. While newer designs and high-performance circuits have reduced the amount of charge which must be stored at a given voltage in, for example, a memory cell, and materials having increased dielectric constants and recent increases in resolution of lithographic processes have allowed some reductions in the physical size required for an integrated circuit capacitor for a given application, most increases in integration density have derived from the development of so-called trench capacitors which are formed vertically within a substrate and thus have a much reduced "footprint" on the surface of the substrate.

The geometry and orientation of trench capacitors require etching and deposition processes which are of increased expense due to the depth of trench required to obtain desired capacitance values. Specifically, since the trenches formed are generally of high aspect ratio (very deep in comparison with the width; narrowness of which is limited by the resolution of currently available lithographic exposure processes), etching and filling of trenches requires the corresponding process steps to be extended in duration. The duration of these processes, of course, carries the economic cost of operating expensive reactor apparatus as well as a fraction of the cost of the reactor apparatus and maintenance thereof which must be amortized over the number of integrated circuits fabricated, as well as the cost of power, chemical materials and the like which are required for and consumed by the process. For example, etch rates during reactive ion etching processes suitable for trench capacitors at the present state of the art in commercial processes are less than 1.0 μm per minute and trench depths on the order of 10.0 μm or more are commonly specified in current integrated circuit designs for trench capacitors and isolation structures. Filling trenches with a dielectric of suitably high dielectric constant usually proceeds even more slowly even though the time required to fill a trench scales with trench width. (That is, there is a trade-off between the capacitor "footprint" and the time required for filling the trench. Extremely narrow trenches with steep sidewalls needed for high integration density thus require process times which are very long.) Further, the filling of narrow, high aspect ratio features is difficult and manufacturing yields are often reduced or device reliability compromised by the closing of the top of the trench during deposition, resulting in the formation of voids within the trench. These voids can cause crystal dislocations and other defects which increase leakage and reduce breakdown voltage of the devices formed.

Since there is an inherent limit to the resolution of lithographic processes and narrowness of trench width has been limited to the minimum feature size which can be resolved in lithographic processes, there has been no solution to reduction of time required for filling of trenches consistent with high manufacturing yields and high integration density. Further, since trench width is limited to the minimum feature size, it has not been possible to reduce trench depth without causing a proportionate decrease in capacitance. Therefore, there has been no solution to the reduction of time required for the etching process at a given minimum size of capacitor "footprint" on the substrate. For example, while it is trivially true that process times could be halved by providing two "half-depth" trenches for each capacitor and some marginal improvement in manufacturing yield might be expected when shallower trenches were filled, the footprint required for developing a given capacitance value at a given feature size would be at least doubled, in view of the spacing required between features. Additionally, circuit layout would be complicated since trench capacitors are often formed in pairs (although each trench capacitor is individually accessible) to increase integration density. Therefore, the number of individually accessible capacitors which could be formed on a given chip or wafer would be at least halved and there would be no net benefit in cost per capacitor for the required processing. On the contrary, the cost impact would be an increase in the cost per capacitor since the number of wafers which can be simultaneously processed in a reactor apparatus is limited and therefore the cost of amortization of the reactor apparatus and maintenance thereof over a given number of wafers would be more than effectively doubled.

Because of these limitations on device fabrication techniques and the resulting geometry of the devices so formed, most major developments in improvement of capacitor value increase or size reduction have been due to metallurgical processes such as the development of hemispherical grain silicon which effectively increases the area of conductors in the capacitor. Improvements in capacitance value/size reduction on the order of 40% have been achieved in this manner. Otherwise, most improvements have been relatively marginal and some improvements which result in improvements in capacitance value/size reduction on the order of 5% to 10% are generally regarded in the art as being highly significant, indeed.

SUMMARY OF THE INVENTION

It is therefore an object of the present invention to provide a trench capacitor structure which allows substantial reduction of trench depth of a given capacitance value without an increase in chip area required.

It is another object of the invention to provide a trench capacitor structure in which the conductor spacing is not limited by minimum feature size under particular design rules.

It is a further object of the invention to provide a trench capacitor structure which can be formed in reduced processing time and which allows reduction of the incidence of voids, thereby exhibiting increased manufacturing yields.

It is yet another object of the invention to provide for the formation of trenches in which capacitors may be formed which are of a sub-lithographic width.

It is a yet further object of the invention to provide a trench structure of potentially sub-lithographic dimensions which may be filled with materials or layers of materials to form isolation structures, capacitors and/or other circuit elements.

In order to accomplish these and other objects of the invention, a method of forming a sub-lithographic feature in a first body of material is provided including the steps of forming a recess in the body of material, isotropically depositing selectively etchable material in the recess to a sub-lithographic thickness, depositing a layer of an etch-resistant material over the layer of selectively etchable material, and anisotropically etching said selectively etchable material and said first body of material.

In accordance with another aspect of the invention, a semiconductor device is provided including at least one trench formation extending into a substrate of monocrystalline semiconductor material, and at least one central feature disposed within the trench which includes a portion comprising monocrystalline semiconductor material.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
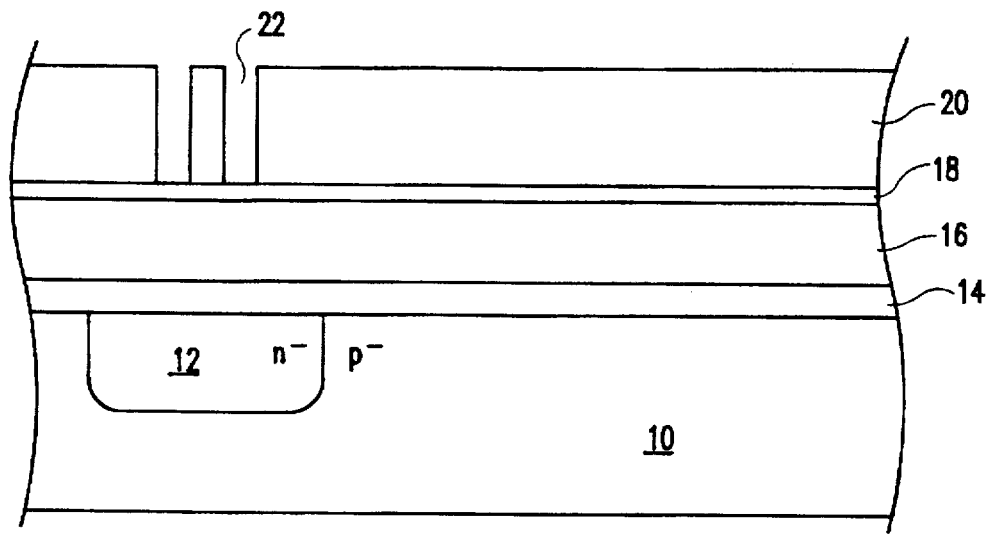
FIG. 1 is a cross-sectional view of an initial stage in the fabrication of a folded trench capacitor in accordance with the invention.

Referring now to the drawings, and more particularly to FIG. 1, there is shown, in cross-section, an early stage of the fabrication of a capacitor structure in accordance with the invention. Specifically, a preferably p- type substrate 10 has an n- well 12 formed therein, preferably by implantation and diffusion of impurities, as is well-understood in the art. However, it is to be understood that structures within the substrate and conductivity types of semiconductor materials used therein are not important to the practice of the invention. A first blanket layer of pad nitride 14 is deposited thereon, followed by a blanket layer of pad oxide (preferably deposited from tetra-ethyl ortho-silicate (TEOS) by known processes) 16 and a second blanket layer of pad nitride 18. This layered structure is commonly referred to collectively as a pad dielectric and other structures forming such a dielectric structure may be used within the scope of the invention. The pad dielectric is then overlaid with a resist layer 20 which is patterned to form openings or recesses 22 at the locations where capacitors, isolation structures or trenches are to be formed; the remaining resist 20 serving to mask other regions of the pad dielectric 14, 16, 18.

At the present state of the art, the preferred minimum width of openings 22 in a direction parallel to the substrate surface is approximately 0.35 μm. This feature size can currently be formed with high manufacturing yield. Smaller features currently cause a loss of manufacturing yield and it is to be understood that the width of the aperture 22 can be made as small as currently available design rules and lithography processes permit, consistent with acceptable manufacturing yield. Therefore, the footprint of the capacitor in accordance with the invention requires no more area of the substrate or wafer surface than is required for a conventional trench capacitor and can be made as small as the state of the lithography art permits.

Figure 2:
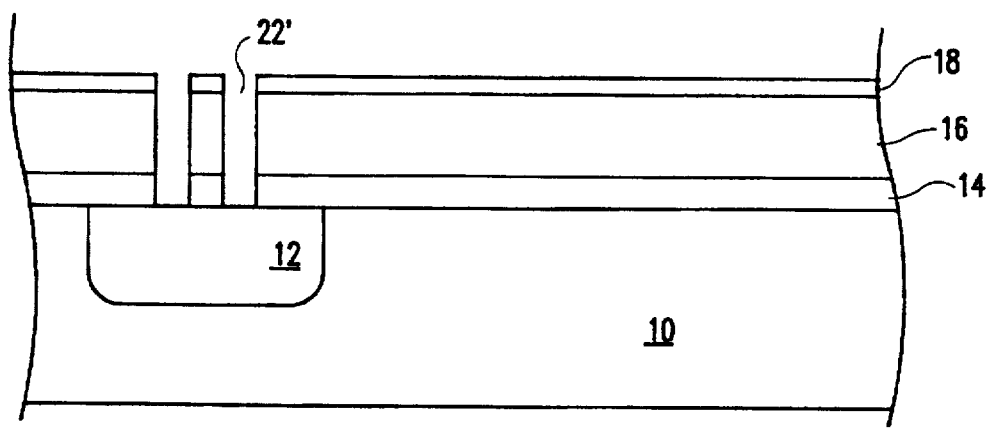
FIGS. 2, 3 and 4 are cross-sectional views of intermediate stages in the fabrication of a folded trench capacitor in accordance with the invention.

Referring now to FIG. 2, an opening 22' is etched into the pad dielectric 14, 16, 18 down to the surface of substrate 10 in accordance with mask 20, 22, preferably by reactive ion etching. The resist mask 20 is then removed to expose nitride layer 18. Regardless of the structure of the pad dielectric, as noted above, it is preferred to provide a final nitride layer 18 or layer of similarly hard material in the pad dielectric as a planarization stop layer by which other later-deposited materials are removed, as will be described below.

Figure 3:
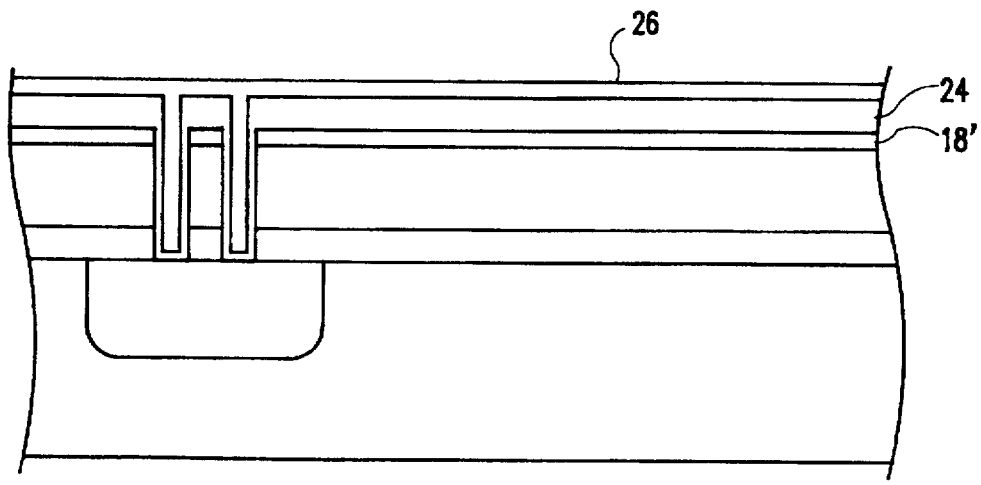

FIG. 3 shows a conformal deposition of a relatively thin layer 24 of a material which can be readily etched; again preferably oxide from TEOS (for a silicon substrate although the principles of the invention are applicable to other substrate materials) since reliable filling of recessed features and good control of layer thickness can thus be obtained in this well-understood process. The thickness of this conformal oxide layer is preferably about 0.15 μm for a trench width of 0.35 μm, leaving a miniature trench of about 50 nm width centrally disposed in the original opening 22'. This miniature trench is then filled with a dielectric material 26, preferably nitride, which exhibits a strong resistance to etching by processes which achieve high etch rates of the material of layer 24, as well as the substrate 10, 12.

It should be noted that the layering of material which can be selectively etched during filling of the trench is an important feature of the present invention since conventional trench capacitors merely fill the trench with a single material. It is also important to note that the layering of materials by isotropic (e.g. conformal) deposition processes provides for the cessation of deposition of the material of all layers except the last which completes the filling of the trench before the trench can be closed. Note also that, for the final layer 26, the deposited thickness need be only slightly in excess of one-half the width of the remaining miniature trench (e.g. 30 nm to fill a miniature trench width of 50 nm). Therefore, while trench filling as performed for conventional trench capacitors often caused the development of voids or so-called keyhole defects below the surface of the pad dielectric, no such defects will develop during the fabrication of the present invention and any voids which do form will be above the surface of layer 18 and will be removed during further process steps.

Figure 4:
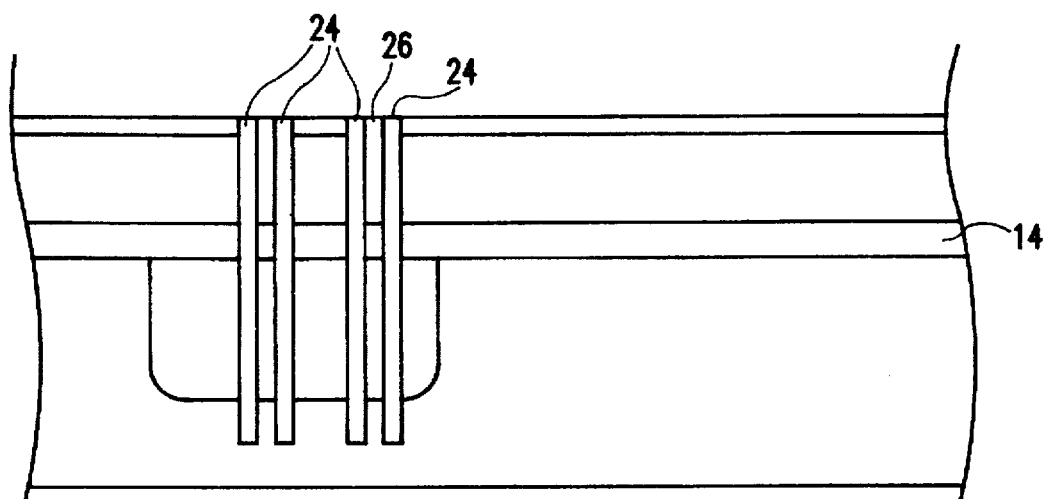

As shown in FIG. 4, planarization of the etch resistant material 26 (or selectively etchable material if more than two layers are deposited to form plural central features in the trench) to nitride layer 18 exposes the top edge of oxide 24 layers within the opening or recess. This material can then be selectively etched anisotropically at a high rate relative to the etch rate of nitride or other etch-resistant material 26. The remaining nitride or other etch-resistant material 26 thus serves as a mask. Subsequent dry etching into the substrate 10 creates a folded trench of the desired depth. Nitride layer 14 in the pad dielectric can also be etched anisotropically without significant diminution of the size or thickness of deposited mask nitride 26. (Any diminution in the height of the remaining mask nitride 26 or even removal thereof will also enhance trench filling and assist in the avoidance of void formation as will be discussed below in regard to variant forms of the invention.)

Figure 5:
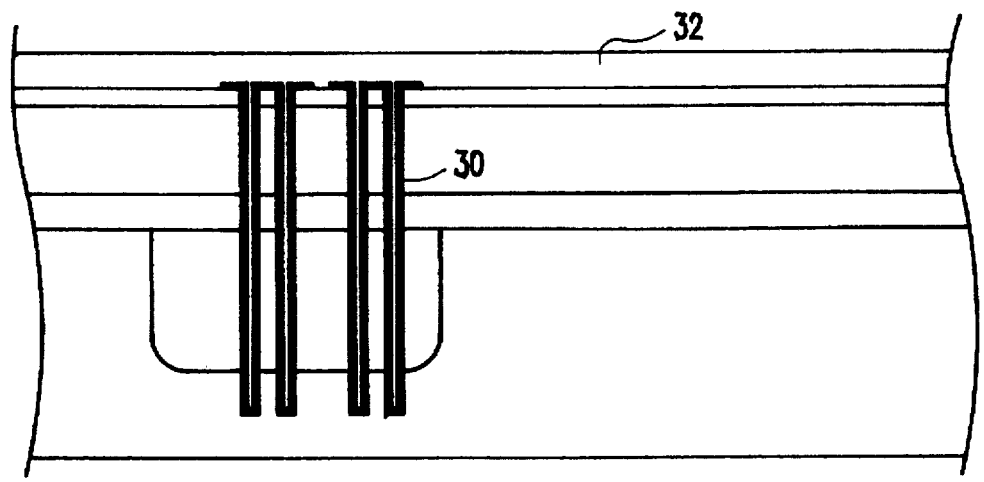
FIG. 5 is a cross-sectional view of a completed folded trench capacitor in accordance with the invention.

As shown in FIG. 5, the capacitor structure may then be completed by depositing a thin layer of capacitor dielectric 30 in the trench formation including miniature trenches comprising the folded trench and filling the remainder of the trenches with doped polysilicon or metal 32 to form a second capacitor electrode; the first capacitor electrode being formed by the n-well and/or substrate. The term "trench formation" will be used hereinafter to refer to a formation which includes a trench which may or may not be filled and, if filled, the term is to be understood as inclusive of all materials and/or material layers which may be formed therein to create a particular type of circuit element or isolation structure.) The capacitors are then electrically separated by planarization to nitride layer 18 and desired connections made through conventional processes.

Thus the selective etching provides a feature centrally located in the trench which establishes an additional two surfaces for formation of the capacitor and effectively increases the ratio of surface area to trench depth by up to a factor of two. Further, the centrally located feature and the trenches comprising the folded trench are formed at a size which is potentially far smaller than the feature size available at any current state of the lithographic art. Therefore, the improved capacitor structure provided in accordance with the invention can be exploited by reducing trench depth with consequential savings in process time and cost, by increasing capacitance value without requiring any increase in chip or wafer area occupied by the capacitor or any combination thereof. In the former case, the two most time-consuming and therefore expensive process steps can be performed at a fraction of the time and cost required in known capacitor structures without any penalty in manufacturing yield or integration density. Manufacturing yield will actually increase since the tendency toward formation of voids during trench filling is reduced.

Additionally, it is important to note that the alternation of layers of material which can be etched with high selectivity causes the formation of further surfaces on features of sub-lithography dimensions. That is, the order of the alternating layers is of substantially less importance to the practice of the invention than the ability to achieve differential etch rates of layers 24 and 26 and, if more than a single pair of such layers is used, order of the oxide and nitride or other selectively etchable materials can be varied at will as an incident of the design of the capacitor structure and geometry. For example, nitride can be used as the first deposited layer (in which case, layer 18 need not be separately formed and etched) followed by oxide, nitride and oxide to provide a structure in which four additional surfaces are formed, for a total of six surfaces; increasing the ratio of capacitance to trench depth by up to a factor of three.

The number of surfaces and the capacitance of the capacitor formed in accordance with the invention may thus be increased substantially at will, depending how nearly ideal conformal or isotropic deposition and anisotropic etching can be selectively done. However, it is important to note that the formation of features having these additional surfaces is not dependent on lithographic techniques and, if more than six surfaces are to be formed, it may be preferable as a matter of process economy or manufacturing yield to repeat the process illustrated in FIGS. 3 and 4 on the structure of FIG. 4 in order to multiply the number of surfaces by a factor of two (or three) for each repetition of trench filling and selective etching. That is, referring to FIG. 6, a relatively thick oxide deposition could be made to reduce trench size and a small (e.g. 50 nm, as before, or smaller) central feature formed by nitride deposit and selective etching to result in two sub-lithographic sized trenches 36 and a central feature formed in each by the process illustrated in FIGS. 3 and 4. In this case, the selective etching need not proceed to full final trench depth.

After formation of trenches 36, a further layer of oxide can be deposited to line each of the trenches 36, followed by a nitride deposit to form a central feature 34 in each trench. Then, when selective etching is performed, each of the sub-lithographic trenches of FIG. 4 will result in two even smaller trenches and a central; feature in each trench; each of which provides an additional two capacitor surfaces. This process can also be repeated substantially at will and with reduced dependence on the isotropy of the deposition, especially of the oxide, and anisotropy and selectivity of the etch since, in the variation of the invention shown in FIG. 6, the number of surfaces will be, for example, multiplied by two for each pair of selectively etchable layers deposited rather than simply increased by two. There is a process time penalty, however, for the additional etching step(s) but this penalty is substantially offset by the fact that the full design depth of the trenches (below surface 18' is preferably achieved in a single etch step after all the masking features 26, 34 have been formed.

In view of the foregoing, it is seen that the invention provides a fabrication technique by which the structure of a trench capacitor may be effectively folded to increase the number of surfaces which form the capacitor. Therefore, the depth of trench required to achieve a given capacitance value may be decreased with consequent savings in process time and increase of manufacturing yield. Since additional surfaces are provided on sub-lithographic features, the area required is not increased and high integration density can be achieved and increased with improved economy and manufacturing yield without reduction of the value of the capacitors formed in accordance with the invention.

Figure 7:
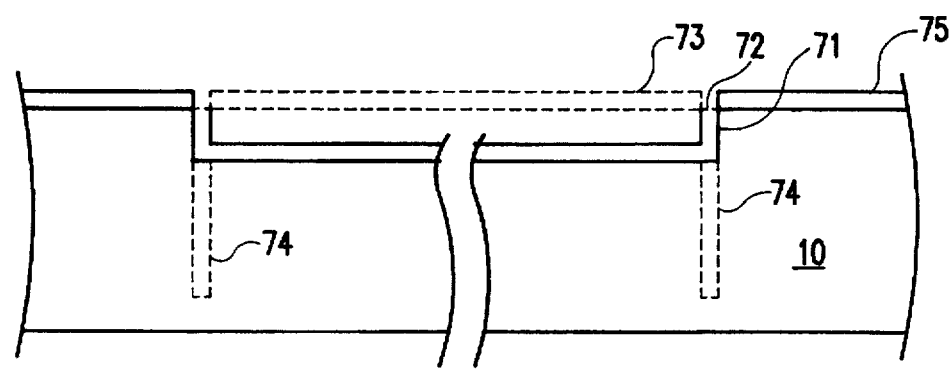
FIG. 7 is a cross-sectional view of an application of a variant form of the invention applicable to isolation structures.

Referring to FIG. 7, it is also to be noted that the central feature of the trench formation and the trench itself need not be formed at the limit of resolution of the lithographic process chosen but could be far larger. For example, if a wide, shallow trench 71 were to be formed by means of dry etching using hard mask 75, then lined with a very thin (e.g. sub-lithographic thickness) layer 72 of selectively etchable material corresponding to layer 24 in FIG. 3 and then the trench refilled to the level shown by dashed line 73, two selective and anisotropic etch steps would produce a potentially sub-lithographic trench with the shape of the outline of the central feature in the form of a relatively large island.

The first etch step would remove the vertical part of the etchable material 72. The second etch step would transfer this pattern into the substrate. In this fashion, trenches 22 with sub-lithographic width initially could be potentially formed and used, with appropriate fill material, for capacitor, isolation structure or other applications. Thus, the invention is seen to provide substantial flexibility in design and a wide variety of structures which can be formed at potentially sub-lithographic dimensions as well as capacitors of increased charge storage capacity with increased fabrication throughput. It should also be appreciated that with appropriate block-out masking, which is generally non-critical as to registration and resolution (e.g. feature size) capacitors and other types of circuit elements advantageously formed in trenches can be produced concurrently with isolation structures.

Figure 8:
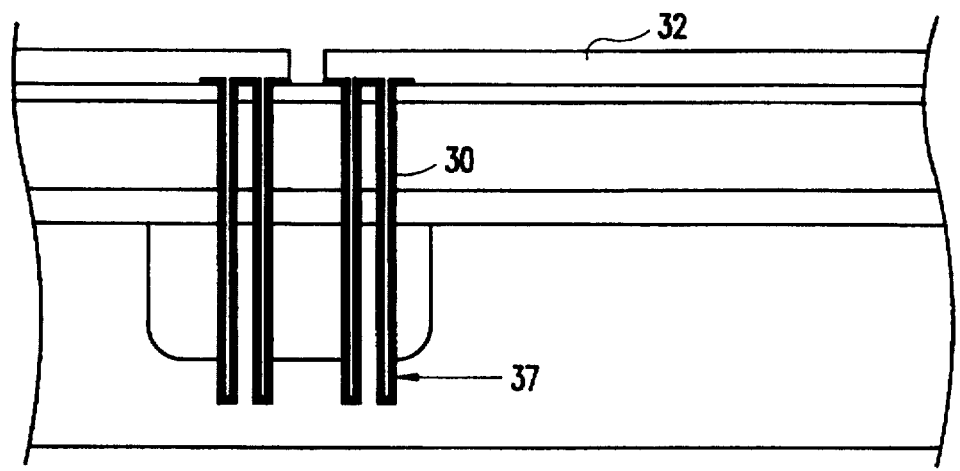
FIG. 8 is a cross-sectional view of a variant form of the invention in which the advantages of the invention are supplemented by trench surface treatments.

As examples of such flexibility in design, several variations of structures which can be formed in accordance with the principles of the invention will now be described with reference to FIGS. 8–11. As a first example, the completion of the capacitor structure described above with reference to FIG. 5 may be accomplished by formation of a layer 37 of hemispherical grain silicon by well-understood techniques or providing alternative surface treatment of the interior of the trenches to increase the effective surface area thereof prior to deposition of the capacitor dielectric, as shown in FIG. 8. In this case, the increase of capacitor plate area provided by the invention is supplemented by the increase of the effective surface area provided by the surface treatment or layer of hemispherical grain material. The reduced trench depth for a given capacitance value provided by the invention enhances the efficacy of the chosen technique for increase of effective area of the capacitor plates and dielectric.

Figure 9:
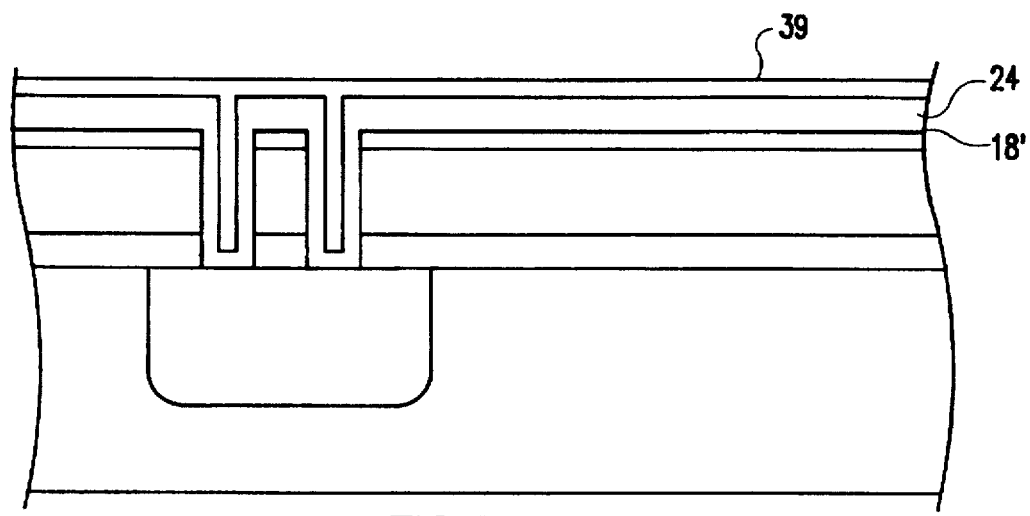
FIG. 9 is a cross-sectional view of another variant form of the invention having advantages in effective trench filling.

Similarly, in the embodiment illustrated in FIG. 9, the deposition of readily etched material 24 illustrated in FIG. 3, is deposited polysilicon and the deposition of etch resistant material 26 of FIG. 3 is replaced by formation of silicon oxide or silicon nitride layer 39 by thermal oxidation or nitridation. This variation of the invention is considered to be preferable when the trenches are very narrow since thermal oxidation, nitridation or other chemical transformation (e.g. by reaction with other materials) causes an expansion of the volume of the silicon which is so reacted. Accordingly, thermal oxidation and other such transformation is particularly effective and self-limiting to fill the trench without the formation of voids. If more than two layers of differentially etchable material are employed, thermal oxidation provides particularly good uniformity of thickness of the etch-resistant layers.

Figure 10:
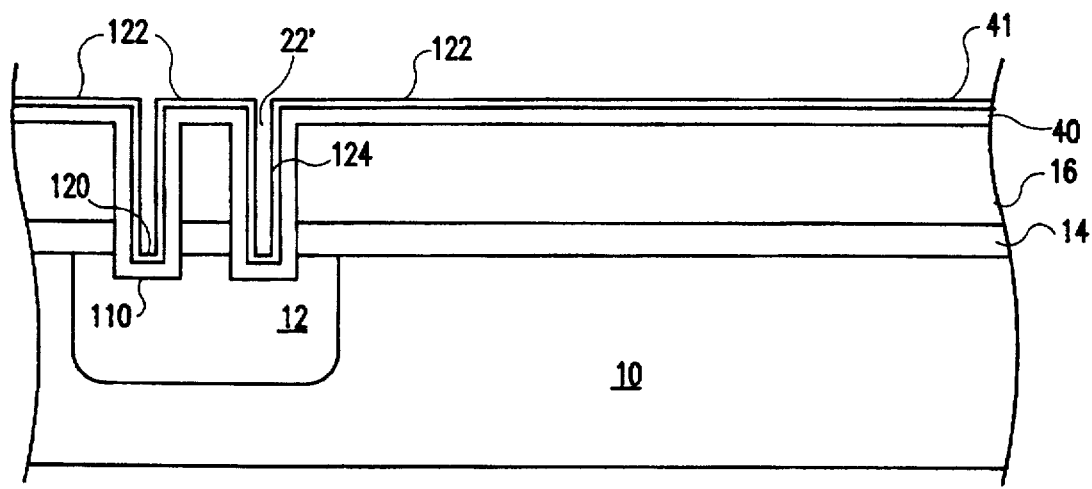
FIGS. 10 and 11 illustrate formation of a further variant form of the invention including a hollow central feature and increased width of the upper region of a folded trench.
Figure 11:
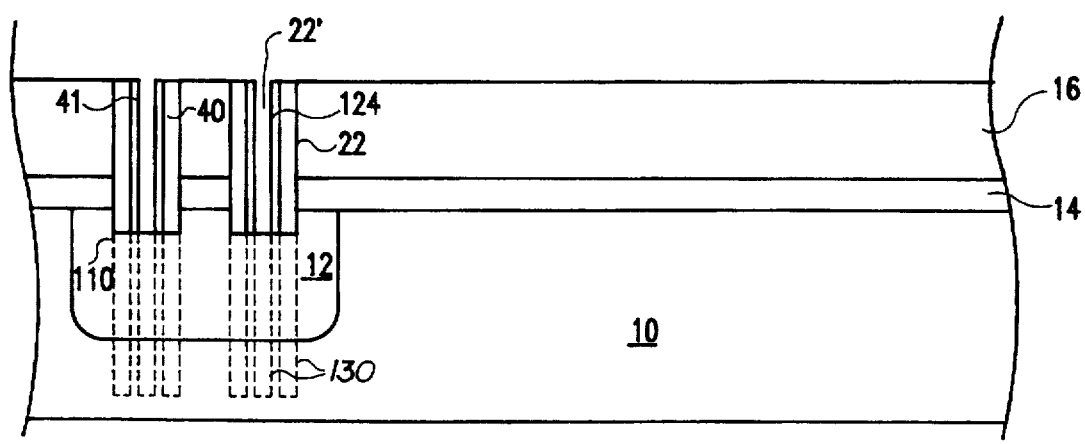

Referring now to FIGS. 10 and 11, further variations of the invention which are also applicable to all of the above-described structures are illustrated. By the same token, it is to be understood that the particular structures and processes illustrated in these Figures and those described above, including the variant forms of the invention described above, are intended to convey a clear understanding of the various features and applicability of principles of the invention and do not necessarily reflect a preferred combination of features or a preferred design for a particular application.

Assuming a structure similar to that of FIGS. 1 and 2 (except that nitride layer 18 need not be provided) a resist layer is used to form openings 22' but which are preferably continued to form a slight recess 110, as shown in FIG. 10, in the surface of the substrate 10 to a depth approximating the thickness of the conformal deposit of silicon 40 which will be formed. The depth of this recess is not critical to the practice of the invention but is preferred in view of the tendency of recessed features to become closed at the top during material deposition such as trench filling, as described above. However, those skilled in the art will recognize from this description that other depths may be preferred for different capacitor geometries and different deposition processes which may proceed with differing degrees of isotropy (or variation from ideal isotropy). In fact, opening 22' need not even reach substrate 10 at all and a minimum depth of opening 22', as a practical matter, would be determined by the process tolerance of the formation (e.g. the thickness) of layer 41 and anisotropic etch of portions of layer 41, described below.

Once openings or recesses 22' are formed, a layer 40 of silicon (e.g. polysilicon) is conformally deposited. Then, as in the embodiments of FIG. 3 or, preferably, FIG. 9, a layer 41 of silicon oxide is formed, preferably by thermal oxidation, for the reasons discussed above. The surface is then anisotropically etched, by any known method, to remove portions 120 and 122 of layer 41, leaving oxide sidewalls 124 substantially intact while exposing portions of the conformally deposited silicon layer 40. It is immaterial to the practice of the invention whether or not the anisotropic etch of portions of layer 41 also removes part or all of the underlying portions of layer 40, as long as the oxide or nitride sidewalls 124 remain intact, since the same portions of layer 40 will then be selectively removed. Removal of horizontal portions of layer 40 which underlie portions of layer 41 removed during the anisotropic etch is depicted in FIG. 11 for clarity.

The structure is then selectively etched anisotropically to remove the remaining portions of layer 40. The structure is then further anisotropically etched to any desired depth, using sidewall portions of layer 41 as a mask to form a hollow pillar structure centrally located in the trench, as indicated by dashed lines 130 in FIG. 11. Since the hollow pillar structure may be etched into the substrate which is preferably of monocrystalline semiconductor material, the trench structure and hollow pillar are thus monocrystalline, which can be exploited to advantage in numerous ways. For example, if the central feature is monocrystalline and/or integral with the substrate, no additional structure is necessary to form a connection with the central feature so that the central feature is electrically accessible from a substrate connection. A monocrystalline central feature is also more robust, mechanically.

The remaining residual silicon oxide, layer 41, is then preferably removed with a wet etch or isotropic dry etch. The structure can then be lined with dielectric (possibly following deposition of hemispherical grain silicon or other area-enhancing surface treatment) and filled with metal or doped semiconductor material to complete the capacitor structure.

Figure 6:
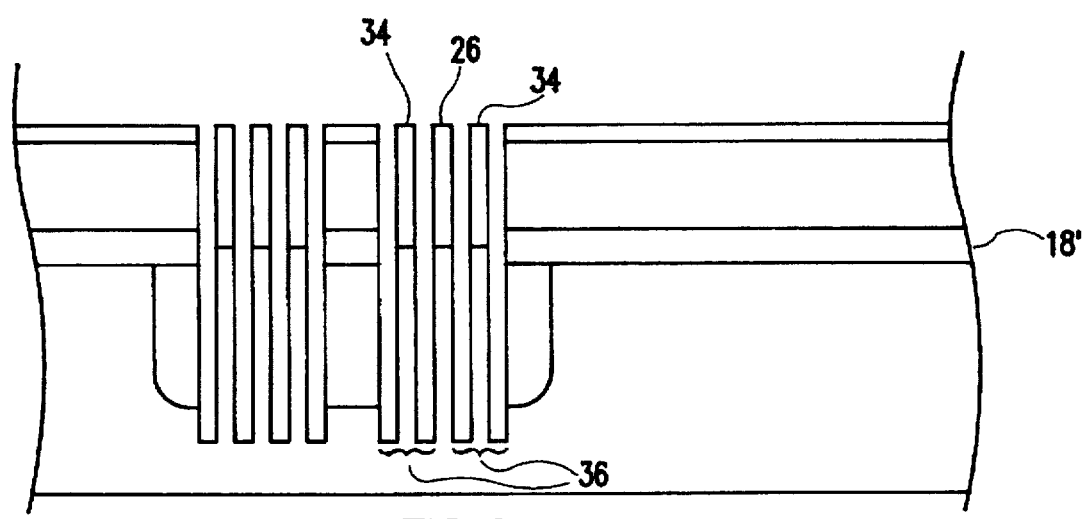
FIG. 6 is a cross-sectional view of a further intermediate stage in the formation of a folded trench capacitor representing a variation of the invention.

The removal of silicon oxide is optional, as in the embodiments illustrated in FIGS. 4 and 6 but is considered preferable since the silicon oxide is a dielectric and does not contribute to the value of the capacitor. Removal of the silicon oxide, however, reliably avoids premature closing of the trench top during filling since the transverse dimension of the opening at the surface of the device is now at least three times as wide as the transverse dimension of any of the openings included in the trench formation in or surrounding the hollow pillar structure. Thus, the lower parts of the trench formation can be readily filled without the formation of voids. Depending somewhat on the aspect ratio of trenches 130, this feature of the invention also allows faster, less expensive and less ideally isotropic deposition methods to be used for the trench filling process while greatly reducing the likelihood of the formation of voids. In this regard and as a practical matter, the increased area and number of surfaces provided by the hollow pillar structure may be exploited to reduce the aspect ratio required to attain a particular capacitance value and formation of voids can be reliably avoided even when less ideally isotropic deposition techniques are employed.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A method of forming a feature in a first body of material including the steps of
   forming a recess in said body of material,
   isotropically forming selectively etchable material in said recess to a thickness,
   forming a layer of an etch-resistant material over said layer of selectively etchable material,
   selectively exposing regions of said selectively etchable material, and
   anisotropically etching said selectively etchable material and said first body of material in said regions exposed by said selectively exposing step,
   wherein said step of forming an etch resistant material is performed by thermal oxidation.

2. A method as recited in claim 1, wherein said body of material includes a pad dielectric.

3. A method as recited in claim 2, wherein said pad dielectric includes a surface layer of silicon nitride.

4. A method as recited in claim 1, including the further step of removing the topmost portion of said etch-resistent material.

5. A method as recited in claim 4, wherein said removing step includes polishing.

6. A method as recited in claim 4, wherein said removing step includes anisotropic etching.

7. A method as in claim 6, wherein said anisotropic etching of said removal step removes said etch resistant material at a bottom surface of said recess.

8. A method as recited in claim 1, including the further step of filing a remainder of said recess with a layer of at least one of a selectively etchable material and an etch resistant material.

9. A method as recited in claim 8, including the further step of planarizing said deposit filling a remainder of said recess.

10. A method as recited in claim 1, wherein said step of forming a layer of etch resistant material includes the step of
    filling a remainder of said recess with a deposit of at least one of a selectively etchable material and an etch resistant material.

11. A method as recited in claim 10, including the further step of planarizing said deposit filling a remainder of said recess.

12. A method as recited in claim 1, including the further steps of
    forming a layer of dielectric on surfaces formed by said anisotropically etching step, and
    forming a conductive layer over said layer of dielectric.

13. A method as recited in claim 12, including the further step of planarizing said conductive material.

14. A method as recited in claim 13, including the further step of forming a conductive pattern connected to a portion of said conductive layer remaining after said planarizing step.

15. A method as in claim 12, wherein said body of material includes a pad dielectric.

16. A method as recited in claim 1, including the further step of forming an isolation structure within a region formed by said anisotropic etching step.

17. A method as in claim 16, wherein said body of material includes a pad dielectric.

18. A method as recited in claim 1, including the further steps of
    depositing a layer of hemispherical grain silicon,
    forming a layer of dielectric on said layer of hemispherical grain silicon, and
    forming a conductive layer over said layer of dielectric.

19. A method as recited in claim 1, including the further steps of
    treating said surface formed by said anisotropically etching step to effectively increase the surface area thereof,
    forming a layer of dielectric on surfaces formed by said anisotropically etching step subsequent to said treating step, and
    forming a conductive layer over said layer of dielectric.

20. A method as recited in claim 1, including the further step of
    removing etch resistant material remaining after said step of anisotropically etching said selectively etchable material.

21. A method as in claim 1, wherein said thickness is no greater than approximately 0.35 μm.

22. A method of forming a feature in a first body of material including the steps of
    forming a recess in said body of material,
    isotropically forming selectively etchable material in said recess to a thickness,
    forming a layer of an etch-resistant material over said layer of selectively etchable material,
    selectively exposing regions of said selectively etchable material,
    anisotropically etching said selectively etchable material and said first body of material in said regions exposed by said selectively exposing step,
    removing the topmost portion of said etch-resistant material,
    wherein said removing step includes anisotropic etching,
    said anisotropic etching of said removal step removing said etch resistant material at a bottom surface of said recess, and
    said anisotropic etching of said selectively etchable material forming a hollow feature within said recess.

23. A method as recited in claim 22, including the further step of
    removing etch resistant material remaining after said step of anisotropically etching said selectively etchable material.

24. A method of forming a feature in a first body of material including the steps of
    forming a recess in said body of material,
    isotropically forming selectively etchable material in said recess to a thickness,
    forming a layer of an etch-resistant material over said layer of selectively etchable material,
    selectively exposing regions of said selectively etchable material,
    anisotropically etching said selectively etchable material and said first body of material in said regions exposed by said selectively exposing step, and filling a remainder of said recess with a layer of at least one of a selectively etchable material and an etch resistant material, wherein said step of forming an etch resistant material is performed by thermal oxidation.

25. A method of forming a feature in a first body of material including the steps of forming a recess in said body of material, isotropically forming selectively etchable material in said recess to a thickness, forming a layer of an etch-resistant material over said layer of selectively etchable material, selectively exposing regions of said selectively etchable material, and anisotropically etching said selectively etchable material and said first body of material in said regions exposed by said selectively exposing step, wherein said step of forming a layer of etch resistant material includes the step of filling a remainder of said recess with a deposit of at least one of a selectively etchable material and an etch resistant material, said step of forming an etch resistant material being performed by thermal oxidation.

* * * * *